United States Patent [19]

Poorman et al.

[11] Patent Number: 5,149,932
[45] Date of Patent: Sep. 22, 1992

[54] ARC/GAS ELECTRODE

[75] Inventors: Richard M. Poorman, Arab; Jack L. Weeks, Guntersville, both of Ala.

[73] Assignee: The United States of America as represented by the Administrator of the National Aeronautics and Space Administration, Washington, D.C.

[21] Appl. No.: 677,182

[22] Filed: Mar. 29, 1991

[51] Int. Cl.⁵ .............................................. B23K 9/24
[52] U.S. Cl. ...................................... 219/75; 219/72
[58] Field of Search .................................. 219/72, 75

[56] References Cited
FOREIGN PATENT DOCUMENTS 591278  2/1978  U.S.S.R. .................................. 219/72
856711  8/1981  U.S.S.R. .................................. 219/72

Primary Examiner—Clifford C. Shaw
Attorney, Agent, or Firm—Robert L. Broad, Jr.; Guy M. Miller; John R. Manning

[57] ABSTRACT

A gas/arc electrode for use under vacuum conditions wherein a first housing encloses a second housing, with an end of the second housing extending through an opening in the first housing and having therein an outlet orifice. Provisions are made for circulating a coolant through the first housing to surround and cool the second housing. An electrical current and a gas, such as argon, as passed through the second housing, with the current flowing through a narrow stream of the ionized gas flowing through the outlet orifice to a workpiece to be treated. The second housing forms a chamber which has a cross sectional area, in a plane perpendicular to the direction of gas flow, of at least ten times the cross sectional area of the outlet orifice such that a gas pressure can be maintained in the chamber to reduce erosion of the chamber walls.

5 Claims, 2 Drawing Sheets

ARC/GAS ELECTRODE

ORIGIN OF THE INVENTION

The invention described herein was made by an employee of the United States Government and may be manufactured and used by or for the Government of the United States of America for government purposes without the payment of any royalties thereon or therefor.

BACKGROUND OF THE INVENTION

1. Field of the Invention

This invention relates to arc/gas electrodes suitable for use in a vacuum environment.

2. Prior art

Gas/arc welding electrodes suitable for use in a vacuum environment are known. Typically, the electrode will be in the form of a tube through which an electrical current and a gas such as argon are passed, the tube being conductive such that the electrical current can be passed through the tube to ionize the stream of gas exiting from the tube and thereby provide a path for the electric arc to reach the workpiece being welded.

A major disadvantage of this type of electrode is that there is a considerable amount of corona discharge from the electrode. Under vacuum conditions and with the head being heated from the flow of electricty through it, there is a considerable amount of erosion of the welding head. This erosion will quickly eat away the end of the tubular electrode from which the gas flows to result in a very short operating life.

SUMMARY OF THE INVENTION

A gas/arc electrode wherein a first housing encloses an electrically conductive second housing which has an end extending through an opening in the first housing, with the second housing having an outlet orifice in the end thereof. The housings are of different sizes such that a coolant can be circulated through the first housing around the second housing to cool the electrode. An inert gas is passed through the second housing to flow through the outlet orifice toward a workpiece to be treated and an electrical current is passed through the second housing to ionize the gas and thereby provide a path for current flow through the outlet orifice to the workpiece. The second housing forms a chamber which has a cross sectional area, in the direction of gas flow, of at least ten times the cross sectional area of the outlet orifice such that a gas pressure can be maintained in the second housing to reduce erosion of the inner wall of the second housing from which electrons are flowing.

DETAILED DESCRIPTION OF THE INVENTION

Figure 1:
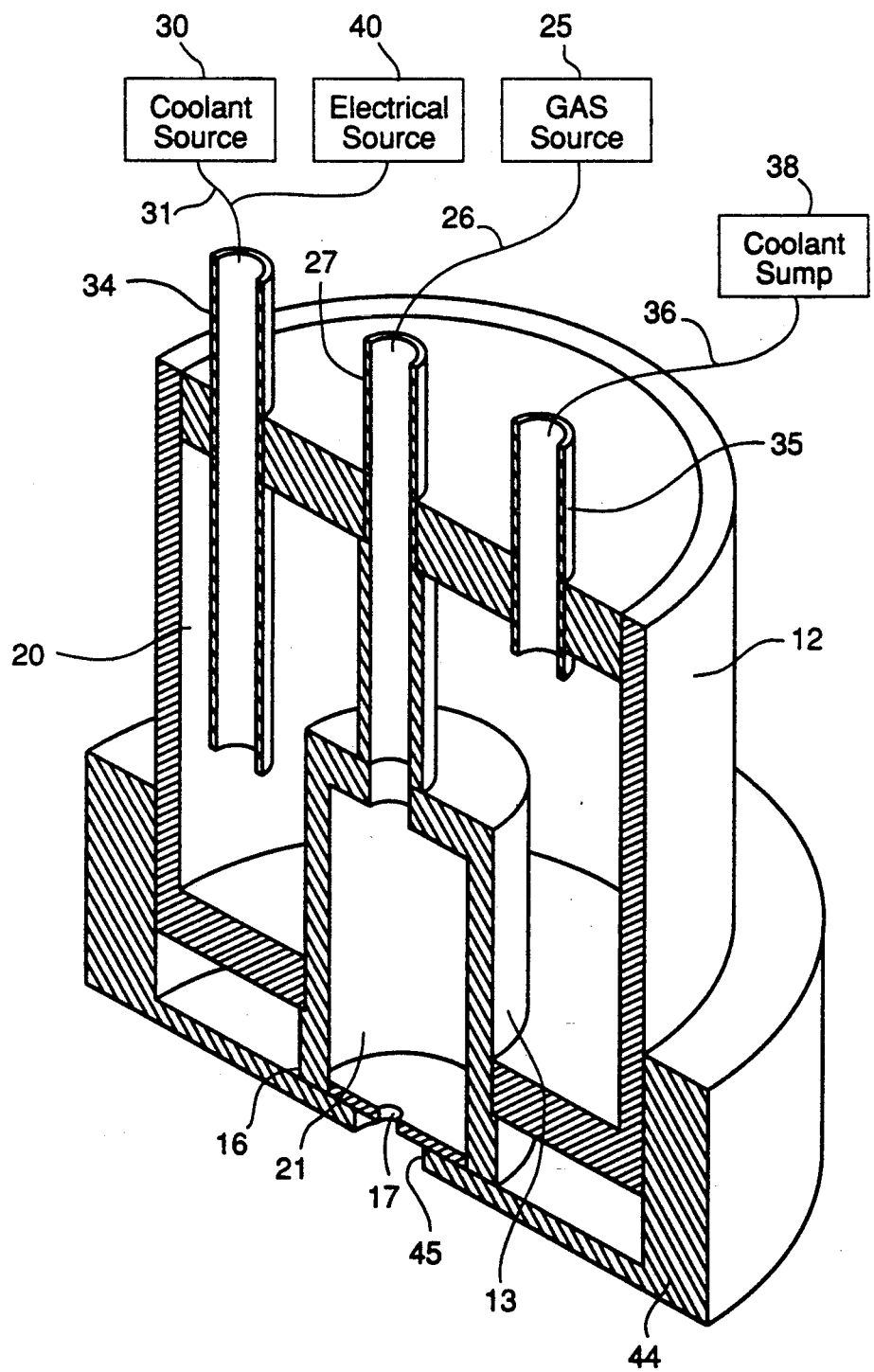
FIG. 1 is a cross sectional view, in perspective, of the gas/arc electrode of this invention showing the positioning of the parts of the device.

The electrode of this inventon is intended to be used under vacuum conditions for such uses as welding, cutting, heating a metal for vapor deposition, etc. The electrode will be positioned in a chamber (not shown) surrounding a workpiece to be treated and the chamber will be evacuated to a pressure of less than about 0.001 torr, with evacuation of the chamber being continued to hold this low pressure as the treatment is carried out. Of course, if the electrode is to be used in outer space, no vacuum chamber is needed.

Referring now in detail to the drawing, there is shown an electrode 11 made up of a first housing 12 having a second housing 13 positioned therein, with the second housing 13 having an end 16 extending through an opening in the first housing 12 so as to be exposed. The housing 13 is made of a conductive material such as copper while the end 16 is made of a metal which will readily emit electrons at an elevated temperature, such as tungsten or tantalum. Alloys of tungsten and small amounts of thorium, yttrium or lanthanum can also be used.

The second housing 13 is smaller than the first housing 12 to form a first chamber 20 surrounding the second housing for the flow of a coolant around the second housing. The second housing 13 forms a second chamber 21 through which a gas such as argon can flow to and through an outlet orifice 17 in the end 16 of the second housing 13.

Argon gas flows from a source 25 through a hose 26 to a gas inlet tube 27 leading to the chamber 20. A coolant, such as a mixture of ethylene glycol and water, flows from a source 30 through a hose 31 to a coolant inlet tube 34 leading to the chamber 20 to cool the electrode. A coolant outlet tube 35 leads from the chamber 20 to a hose 36 leading to a coolant sump 38.

It will be noticed that one of the tubes 34 and 35 terminates at one end of the chamber 20 and other termiates at the other end of the chamber 20. This is to provide for a good flow of coolant through this chamber. Coolant is passed through the electrode at a rate sufficient to maintain the temperature of the electrode at not more than about 150 to 200 degrees F.

Under certain conditions it may not be necessary to use the housing 12 and it and the associated structure for passing a coolant through the electrode can be eliminated. For example, it may under certain conditions be possible to fit the housing 13 with fins (not shown) which would radiate heat from the housing 13 at a rate sufficiently high to keep this housing at a reasonable temperature.

The hose 31 is preferably a conventional arc./gas hose which has a conductive metallic braid built into the hose for carrying an electrical current from a source 40 to the electrode 11 while the hose itself carries the coolant.

The electrical source 40 is such that an initial high voltage of about 20,000 volts can be applied to the electrode 11 to ionize the argon gas flowing through the electrode to a workpiece 41 (FIG. 2) to be treated. After the gas stream is ionized, the voltage applied to the electrode 11 is dropped to about 20 volts dc, with the electrode being negative and the workpiece being positive. Such power supplies are known.

To reduce corona discharge from the electrode, the lower end of the first housing is fitted into an insulator 44 made of lava stone, with an aperture 45 being provided in the insulator 44 to expose the tungsten end of the second housing 13.

Erosion resulting from corona in the chamber 21 is reduced by maintaining the pressure of the gas in this chamber within the range of about 0.1 to 1.0 torr. This is made possible by the ratio of the cross sectional area of the chamber relative to the cross sectional area of the outlet orifice 17. The cross sectional area of the chamber 21, in a plane perpendicular to the direction of gas flow, should be at least ten times the cross sectional area of the orifice 17. This will allow the chamber 21 to be held at a pressure of 0.1 to 1.0 torr. This pressure, which is much greater than the about 0.001 torr in the treatment chamber, reduces erosion of the surface of the chamber 21 for a much longer electrode operating life.

Figure 2:
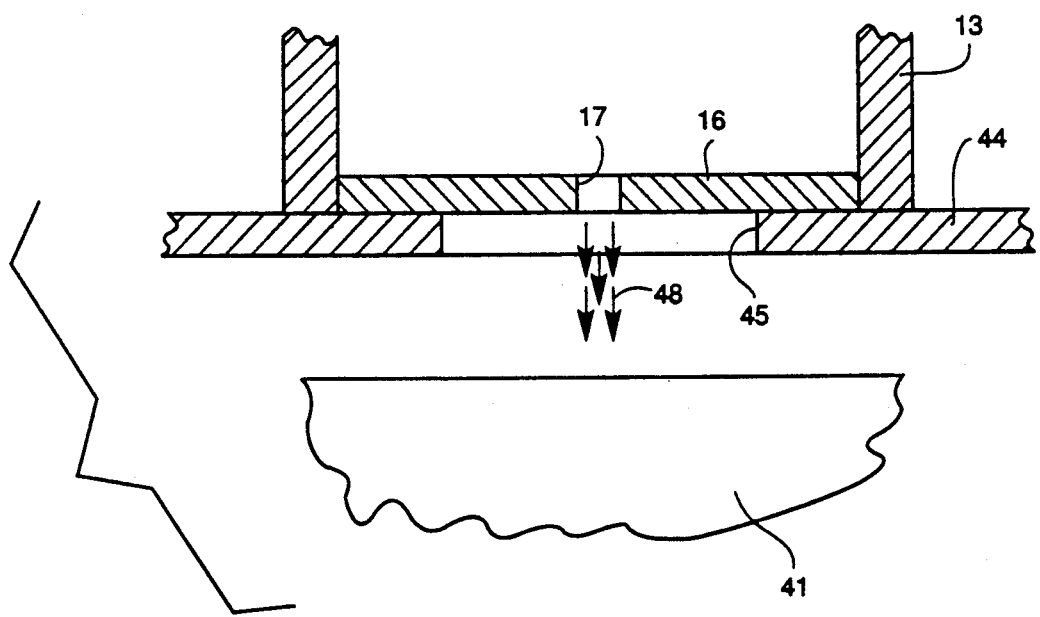
FIG. 2 is an enlarged fragmentary view showing how the ionized gas flows from the electrode to a workpiece to form a path for electrical current.

In ooperation, argon gas is passed from the source 25 to and through the electrode to exit the electrode through the orifice 17 in a narrow, ionized, stream 48 which is represented by arrows in FIG. 2, with the coolant being passed through the electrode 11 from the source 30.

The initial application of a high voltage to the electrode will ionize the argon gas in the chamber 21 and in the stream 48 impinging on the workpiece 41 (FIG. 2) to form a conductive path for the electrical current to flow from the electrode 11 to the workpiece 41. The use of the chamber 21, as compared to the conventional tubular electrode, allows for the pressurization of the chamber 21 to reduce erosion from the inner walls of the second housing 13 and to provide conditions under which the argon gas can easily be ionized.

The voltage is then dropped and the treatment carried out. Electrons will flow from the surfaces forming the chamber 21 through the orifice 17 to the workpiece 41. Because of the large surface area of the chamber 21 and the gas pressure in this chamber, erosion of the chamber walls will be very low.

What is claimed is:

1. A gas/arc electrode comprising
   a. a first housing,
   b. a second housing positioned inside the first housing and having an end extending through an opening in said first housing to an exposed position, said second housing being electrically conductive and having an outlet orifice in said end, said first housing being larger than the second housing to form a first chamber surrounding the second housing, said second housing forming a second chamber,
   c. means for circulating a coolant through said first chamber into contact with the second housing to cool said second housing and said electrode,
   d. means for supplying a gas to the second chamber, and
   e. means for supplying an electrical current to the second housing to ionize the gas flowing from the orifice to provide a current path from the electrode to a workpiece positioned adjacent to said orifice.

2. The electrode of claim 1 wherein the coolant is introduced into the first chamber adjacent to one end thereof and withdrawn from a point adjacent to the other end of said chamber.

3. The head of claim 3 wherein a portion of the first chamber surrounding said opening in said first housing is electrically insulated.

4. The apparatus of claim 3 wherein said insulation is lava stone.

5. A gas/arc electrode comprising
   a. a housing forming a chamber, said chamber having an outlet orifice for the flow of a gas from the chamber to a workpiece,
   b. means for supplying a gas to the chamber at a predetermined rate,
   c. means for supplying an electrical current to the housing, said chamber having a cross sectional area in a plane perpendicular to the direction of gas flow of at least ten times the cross sectional area of the outlet orifice, and
   d. means for bringing a coolant into contact with the housing to cool said housing.

* * * * *